(12) United States Patent
Frankowsky et al.

(10) Patent No.: US 7,034,559 B2
(45) Date of Patent: Apr. 25, 2006

(54) INTEGRATED TEST CIRCUIT IN AN INTEGRATED CIRCUIT

(75) Inventors: Gerd Frankowsky, Höhenkirchen-Siegertsbrunn (DE); Robert Kaiser, Kaufering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/780,104

(22) Filed: Feb. 17, 2004

(65) Prior Publication Data

US 2004/0222810 A1    Nov. 11, 2004

(30) Foreign Application Priority Data

Feb. 18, 2003    (DE)    ................................. 103 06 620

(51) Int. Cl.
*G01R 31/28*    (2006.01)
(52) U.S. Cl. ...................................... 324/763; 324/765
(58) Field of Classification Search ................ 324/763, 324/765; 714/733, 734
See application file for complete search history.

(56) References Cited

U.S. PATENT DOCUMENTS

| | | | | |
|---|---|---|---|---|
| 4,357,703 A | * | 11/1982 | Van Brunt | ................... 714/733 |
| 4,635,261 A | * | 1/1987 | Anderson et al. | ........... 714/732 |
| 4,931,722 A | * | 6/1990 | Stoica | ........................ 714/733 |
| 5,030,904 A | * | 7/1991 | Tanksalvala et al. | ........ 324/537 |
| 5,418,470 A | | 5/1995 | Dagostino et al. | |
| 5,642,057 A | * | 6/1997 | Oke et al. | .................... 324/763 |

FOREIGN PATENT DOCUMENTS

| | | |
|---|---|---|
| DE | 100 63 102 | 8/2001 |
| DE | 101 10 626 | 10/2002 |

* cited by examiner

*Primary Examiner*—Ernest Karlsen
(74) *Attorney, Agent, or Firm*—Patterson & Sheridan, L.L.P.

(57) ABSTRACT

The invention relates to an integrated test circuit in an integrated circuit for testing a plurality of internal voltages. A switching device is provided to select one of the internal voltages in accordance with a selection signal for the purpose of testing, and a comparator device is provided in order to compare a measurement voltage, dependent on the selected internal voltage, with an externally provided reference voltage. An error signal is output as a result of the comparison.

20 Claims, 2 Drawing Sheets

INTEGRATED TEST CIRCUIT IN AN INTEGRATED CIRCUIT

CROSS-REFERENCE TO RELATED APPLICATIONS

This application claims foreign priority benefits under 35 U.S.C. §119 to co-pending German patent application number 103 06 620.9-35, filed Feb. 18, 2003. This related patent application is herein incorporated by reference in its entirety.

BACKGROUND OF THE INVENTION

1. Field of the Invention

The invention relates to an integrated test circuit in an integrated circuit for testing a plurality of internal voltages, a switching device being provided in order to select one of the internal voltages in accordance with a selection signal for the purpose of testing, a comparator device being provided in order to compare a measurement voltage, dependent on the selected internal voltage, with an externally prescribed reference voltage and in order to output an error signal as a result of the comparison.

2. Description of the Related Art

Integrated semiconductor circuits are checked with regard to their correct functioning during and after their production. When testing semiconductor circuits, it is necessary, inter alia, to test voltages generated internally in the semiconductor circuit, i.e. to test whether the internally generated voltage corresponds to the desired voltage. For this purpose, it is usually the case that the internally generated voltages are accessible externally via special test terminals, so that a connected tester device taps off the voltage and can compare the latter with a reference voltage.

In order to save test terminals on the integrated circuit, it is also known, when there are a plurality of internally generated voltages, to provide a multiplexer device which applies the different voltages to a common test terminal provided therefor, under the control of an integrated test circuit or the connected external tester device. Via the common test terminal, the internally generated voltages can then be compared successively with a respective reference voltage and it is thus possible to check whether the internally generated voltage corresponds to the desired voltage.

Generally, the test terminals used for this are available only during the front end test, i.e. in the unsawn state of the integrated semiconductor circuits. The test terminals are no longer accessible after the circuits have been sawn and housed, so that generally it is no longer possible to check the internal voltages. This is disadvantageous since the integrated semiconductor circuit is influenced by test steps which take place after the front end test, by sawing and housing, and the internally generated voltages may change as a result.

A further disadvantage is that, for measuring the voltages, the corresponding resources, i.e. tester channels have to be provided by the tester device. This is disadvantageous in particular when effecting parallel testing of semiconductor circuits, since the semiconductor circuit to be tested has to be connected to the tester device via a relatively large number of tester channels. The relatively large number of test lines reduces the parallelism and thus the throughput when testing semiconductor circuits.

SUMMARY OF THE INVENTION

It is an object of the present invention to provide a test circuit which simplifies the testing of a plurality of internal voltages and furthermore still enables the testing of a plurality of internal voltages also in the back end test method.

A first aspect of the present invention provides an integrated test circuit in an integrated circuit in order to test a plurality of internal voltages. A switching device is provided in order to select one of the internal voltages in accordance with a selection signal for the purpose of testing, a comparator device comparing a measurement voltage, dependent on the selected internal voltage, with an externally prescribed reference voltage and outputting an error signal as a result of the comparison.

The integrated test circuit according to the invention has the advantage that the checking of the internal voltage can be carried out within the integrated circuit and it is thus possible to save resources of a connected tester device. In other words, the tester device does not have to provide resources for comparing the internal voltages with a reference voltage. Furthermore, it is possible to select the internal voltages by means of the switching device, so that only a comparator device is necessary in the integrated test circuit and the results of the comparison can be read out at the output of the comparator device. In this way, it is possible to avoid providing a plurality of external terminals via which the individual internal voltages can be read out. This constitutes a considerable advantage since the number of external terminals is usually very limited.

It may be provided that the measurement voltage directly corresponds to the selected internal voltages, or that a voltage divider is provided in order to generate the measurement voltage as a predetermined fraction of the internal voltage to be tested. The advantage of the voltage divider consists in a reference voltage that is made available being used to test a plurality of internal voltages, including different internal voltages, successively with the aid of the comparator device.

In order to select the internal voltage to be measured of the switching device, a control circuit may be provided in order to connect one of the plurality of voltage dividers to the comparator device.

The error signal may, in one embodiment, be read out directly at a terminal of the integrated circuit; in another embodiment, a storage element may be provided in order to buffer-store the error signal. The error signal may then be read out externally at a suitable point in time, for example via a signal terminal.

Preferably, the signal terminal is connected to the storage element or the comparator device in a switchable manner via a switching element in order, via the signal terminal, to read the storage element or to apply the reference voltage to the comparator device. In this way, it is possible to carry out the provision of the reference voltage and the read-out of the test result for the internal voltage via the signal terminal. In this case, firstly the reference voltage is applied to the signal terminal and the internal voltage is selected in accordance with a selection signal. The comparator device supplies a result of the comparison of the reference voltage and the measurement voltage and stores the result in the storage element. Through the changeover of the switching element, the storage element is then connected to the signal terminal such that the error signal stored in the storage element can be read out by a connected tester device.

A further switching element may be provided, whereby the signal terminal is connectable to an internal signal line of the integrated circuit, for receiving and/or for outputting signals. In this way, it is possible to use a signal terminal for testing the integrated circuit, which signal terminal constitutes, for example, a data input/output in later normal operation.

Preferably, the switching element and/or the further switching element can be controlled by a test control signal, which is prescribed either internally in the integrated circuit or by the connected tester device.

A further aspect of the present invention provides a method for testing an integrated circuit having a test circuit according to the invention. In this case, firstly an internal voltage of the integrated circuit is selected and a reference voltage is made available externally. A measurement voltage, which is dependent on the selected internal voltage, is compared with the reference voltage that is made available, as a result of the comparison an error signal being generated for outputting to a tester device.

BRIEF DESCRIPTION OF THE DRAWINGS

Preferred embodiments of the invention are explained in more detail below with reference to the accompanying drawings, in which.

DETAILED DESCRIPTION OF THE PREFERRED EMBODIMENT

Figure 1:
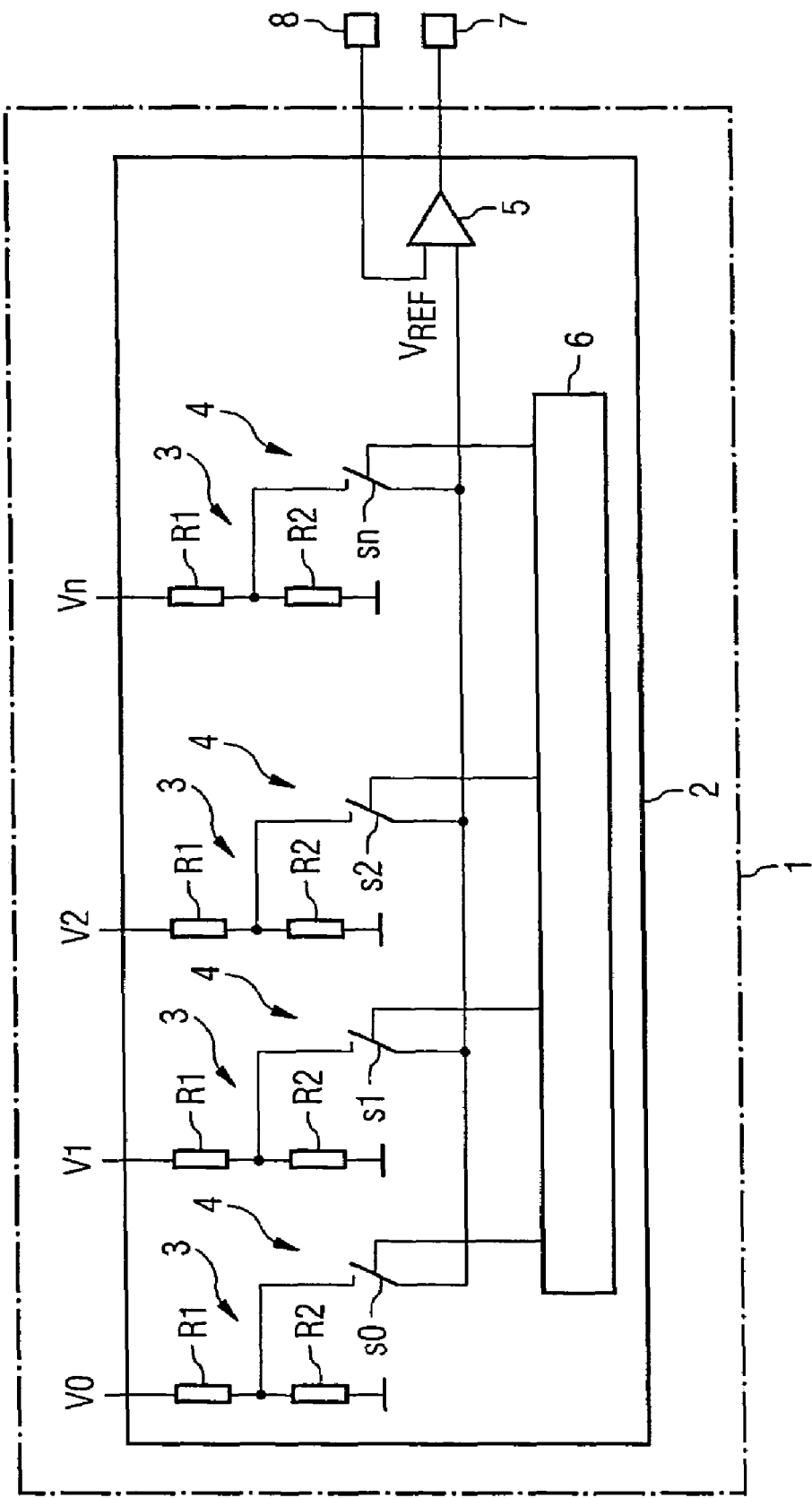
FIG. 1 shows a first embodiment of the test circuit according to the invention.

FIG. 1 illustrates an integrated circuit 1 having a test circuit 2 for testing a plurality of internal voltages V0, V1, V2 . . . Vn. The test circuit comprises a plurality of voltage dividers 3 each comprising a first resistor R1 and a second resistor R2.

Each of the voltage dividers 3 is connected to a first input of a comparator device 5 via a switch 4. The switches 4 are controlled via a control unit 6, so that in each case only one of the switches 4 is closed in order to connect a respective one of the voltage dividers to the first input of the comparator device 5.

The voltage dividers generate a measurement voltage, which is compared with a reference voltage $V_{ref}$ present at the second input of the comparator device 5. The comparator device 5 has an output, at which an error signal can be output via a signal terminal 7. The reference voltage $V_{ref}$ is usually made available to the comparator device 5 via a further signal terminal 8.

The switches 4 are controlled via the control unit 6 in such a way that in each case only one of the switches 4 is closed in order to apply only one of the measurement voltages to the first input of the comparator device 5. Instead of the control unit 6 for controlling the switches 4, an external control may also be provided for the switch 4 by provision of further signal terminals, with which the switches 4 can be controlled. In this case, during the testing of the integrated circuit 1, a connected tester device would have to undertake the control of the switches 4 via the further signal terminals.

The voltage dividers 3 are dimensioned such that they generate from the internal voltages V0, V1, V2 . . . Vn a respective measurement voltage, which essentially have suitable potentials similar to one another, which are ideally identical, i.e. all the internal voltages have the desired voltage. In this case, it is possible that only one reference voltage has to be made available, so that only one signal terminal 8 is required for the provision of the reference voltage $V_{ref}$. It goes without saying that in the case where different reference voltages are provided, it may be provided that the voltage dividers 3 generate measurement voltages that differ significantly from one another. The voltage dividers 3 then have to be dimensioned such that they provide a voltage which is essentially so far away from the upper and lower supply voltage of the comparison device 5 that the transistors of the comparison device 5 are driven with a minimum voltage.

The control unit 6 may either be controlled via an externally connected tester device or automatically carry out a predetermined test method.

During the testing of the integrated circuit 1 with the aid of a tester device, firstly a reference voltage $V_{ref}$ is applied to the further signal terminal 8. Afterward, each of the switches 4 is closed individually essentially one after the other, in order to apply a respective measurement voltage, formed from the internal voltages V0, V1, V2 . . . Vn, to the first input of the comparator device. The comparator device compares the reference voltage $V_{ref}$ with the respective measurement voltage and outputs the result of the comparison to the signal terminal 7, from where it can be read out by the tester device.

Figure 2:
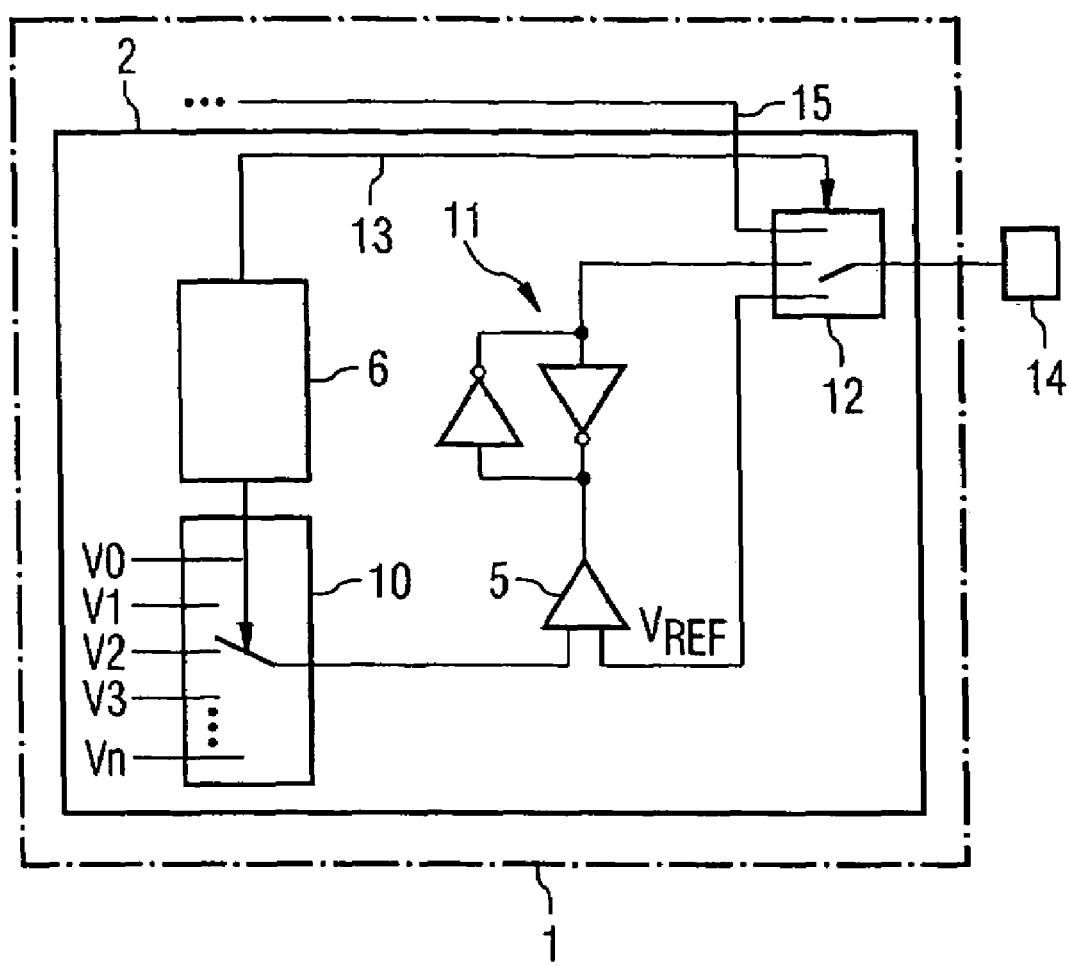
FIG. 2 shows a further preferred embodiment of a test circuit of the invention.

FIG. 2 illustrates a further embodiment of the test circuit according to the invention. Identical reference symbols correspond to essentially identical elements.

The test circuit 2 illustrated in FIG. 2 likewise has a comparator device 5, the first input of which is connected to a multiplexer circuit 10, via which a plurality of internal voltages V0, V1, V2 . . . Vn can be applied in switchable fashion. The control unit 6 determines which of the internal voltages V0, V1, V2 . . . Vn is applied to the first input of the comparator device 5.

The embodiment illustrated in FIG. 2 also affords the possibility, instead of applying the internal voltages V0, V1, V2 . . . Vn directly to the comparator device 5, of generating measurement voltages with the aid of voltage dividers and applying the measurement voltages to the first input of the comparator device 5 in switchable fashion.

A second terminal of the comparator device 5 is connected to a switching element 12, via which the reference voltage $V_{ref}$ can be applied to the second input of the comparator device 5.

The comparator device 5 is preferably configured in such a way that it uses an error datum to specify whether the voltages are essentially equal or different.

An output of the comparator device 5 is connected to a storage element 11, which stores the result of the comparison between the reference voltage $V_{ref}$ and the respectively selected internal voltage V0, V1, V2 . . . Vn. The switching element 12 is configured such that, in a manner controlled via a test control line 13, which connects the switching element 12 to the control unit 6, it connects a signal terminal 14 either to the second input of the comparator device 5 or to the output of the storage element 11 or to an internal signal line 15 of the integrated circuit.

The storage element 11 is preferably designed as a latch having two oppositely coupled inverters.

The test circuit illustrated in FIG. 2 makes it possible for a signal terminal which is used for the normal operation of the integrated circuit and is connected to the internal signal line 15 during normal operation also to be used for testing the plurality of internal voltages V0, V1, V2 . . . Vn. For this purpose, firstly the switching device 10 is switched such that one of the internal voltages, e.g. the internal voltage V0, is applied to the first input of the comparator device 5. At the same time, the switching element 12 is switched such that the signal terminal 14 is connected to the second terminal of the comparator device 5 in order to apply a reference voltage $V_{ref}$ to the second input of the comparator device 5.

The reference voltage $V_{ref}$ is usually made available by a connected tester device (not shown). Afterward, the switching element 12 is switched such that the signal terminal 14 is connected to the output of the storage element 11. The result of the last comparison that was carried out is stored in the storage element 11 and specifies whether and, under certain circumstances, in what way the selected internal voltage deviates from the reference voltage $V_{ref}$. Via the signal terminal 14, it is thus possible to read out the result of the comparison from the tester device.

The switching of the switching element 12 is controlled by the control unit 6, in the same way as the switching of the switching device 10. The control unit 6 may carry out a test sequence in accordance with a method prescribed by the tester device or independently.

The embodiment of the test circuit according to the invention as shown in FIG. 2 thus makes it possible to test the internal voltages by means of only one signal terminal 14, which is furthermore connected to an internal signal line 15 during normal operation, so that the signal terminal 14 may also be operated as a data input and/or output. Tester resources are saved by virtue of the fact that the testing of the internal voltages proceeds virtually completely within the integrated circuit. The fact that only one signal terminal 14 has to be used means that only one test line, too, is necessary for connecting the integrated circuit 1 to a tester device. This reduces the total number of connected test lines, so that a larger number of integrated circuits 1 can be tested simultaneously at a tester device.

Furthermore, the test circuit according to the invention has the advantage that the testing of the internal voltages can be performed even with a housed integrated circuit, since the testing can be carried out via a signal terminal which is used during normal operation.

What is claimed is:

1. An integrated circuit, comprising:
    an integrated test circuit in the integrated circuit for testing a plurality of internal voltages of the integrated circuit, the integrated test circuit comprising:
        a switching device configured to select one of the internal voltages in accordance with a selection signal;
        a comparator device configured to compare a measurement voltage, corresponding to the selected internal voltage, with an externally provided reference voltage and to output an error signal as a result of the comparison; and
        a storage element in communication with the comparator device to store data corresponding to the error signal.

2. The integrated circuit of claim 1, wherein the switching device is a multiplexer.

3. The integrated circuit of claim 1, further comprising a voltage divider for each of the internal voltages, the voltage dividers being configured so that the measurement voltage corresponding to the respective internal voltage has the same potential at each voltage divider.

4. The integrated circuit of claim 1, further comprising a signal terminal and a second switching element operable to selectively connect the signal terminal to the storage element, whereby the error signal may be read out by an external device connected to the signal terminal.

5. The integrated circuit of claim 4, wherein the second switching element is further operable to selectively connect the comparator device to the signal terminal to apply the reference voltage to the comparator device.

6. The integrated circuit of claim 5, wherein the second switching element is further operable to selectively connect the signal terminal to an internal input/output signal line of the integrated circuit.

7. The integrated circuit circuit of claim 6, further comprising a control circuit configured to issue test control signals to the switching device and the switching element.

8. An integrated circuit, comprising:
    a test circuit for testing a plurality of internal voltages utilized in the integrated circuit, the test circuit comprising:
        a first switching device having a selection signal input for receiving a selection signal, the switching device configured to selectively connect to one of the plurality of internal voltages in accordance with the received selection signal;
        a comparator device configured to compare a measurement voltage, corresponding to the selected internal voltage, with an externally provided reference voltage and to output an error signal based on the comparison; and
        a storage element connected to receive an output of the comparator device and store data corresponding to the error signal.

9. The integrated circuit of claim 8, wherein the test circuit further comprises:
    a control unit configured to provide the selection signal to the switching device.

10. The integrated circuit of claim 9, further comprising:
    a signal terminal configured to provide an external reference voltage to the comparator.

11. The integrated circuit of claim 10, wherein the test circuit further comprises:
    a second switch connected to the signal terminal, wherein the second switch is configured to selectively connect the signal terminal to one of the comparator device, an output of the storage element, and an internal signal line of the integrated circuit which is utilized during normal operation of the integrated circuit.

12. The integrated circuit of claim 11, wherein the control unit is further configured to control the second switch.

13. The integrated circuit of claim 12, wherein the signal terminal is utilized to read out the data stored in the storage element when the second switch is set to connect the signal terminal to the output of the storage element.

14. The integrated circuit of claim 13, wherein the storage element comprises a latch having two oppositely coupled inverters.

15. The integrated circuit of claim 9, wherein the first switching device is a multiplexer.

16. The integrated circuit of claim 8, wherein the test circuit further comprises:
    a voltage divider for each of the internal voltages, each voltage divider configured to provide the respective measurement voltage corresponding to the respective internal voltage.

17. The integrated circuit of claim 8, wherein the voltage dividers provide substantially similar voltage levels.

18. A method for operating an integrated circuit, comprising:
  providing a test circuit in the integrated circuit for testing a plurality of internal voltages utilized in the integrated circuit, the test circuit comprising:
    a first switching device having a selection signal input for receiving a selection signal, the switching device configured to selectively connect to one of the plurality of internal voltages in accordance with the received selection signal;
    a comparator device configured to compare a measurement voltage, corresponding to the selected internal voltage, with an externally provided reference voltage and to output an error signal based on the comparison; and
    a storage element connected to receive an output of the comparator device and store data corresponding to the error signal;
  providing the selection signal to the first switching device to select one of the internal voltages;
  receiving the reference voltage from an external source connected to the test circuit;
  comparing a measurement voltage corresponding to the selected internal voltage with the reference voltage; and
  storing data corresponding to the error signal in the storage element.

19. The method of claim 18, further comprising:
  providing, in the test circuit, a second switch connected to a signal terminal of the integrated circuit, wherein the second switch is configured to selectively connect the signal terminal to one of the comparator device, an output of the storage element, and an internal signal line of the integrated circuit which is utilized during normal operation of the integrated circuit; and
  selectively connecting the signal terminal to the output of the storage device, via the second switching device; and
  reading out the error signal stored in the storage element.

20. The method of claim 18, further comprising:
  after completing the testing of the internal voltages, setting the second switch to connect the signal terminal to the internal signal line of the integrated circuit which is utilized during normal operation of the integrated circuit.

* * * * *